United States Patent
Tsuji et al.

(10) Patent No.: US 7,488,566 B2
(45) Date of Patent: Feb. 10, 2009

(54) POSITIVE TYPE RADIATION-SENSITIVE RESIN COMPOSITION

(75) Inventors: Takayuki Tsuji, Tokyo (JP); Tomoki Nagai, Tokyo (JP); Kentarou Harada, Tokyo (JP); Daisuke Shimizu, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/391,257

(22) Filed: Mar. 29, 2006

(65) Prior Publication Data
US 2006/0223010 A1   Oct. 5, 2006

(30) Foreign Application Priority Data
Mar. 29, 2005   (JP) ............................. 2005-093385

(51) Int. Cl.
G03F 7/00      (2006.01)
G03F 7/004     (2006.01)
(52) U.S. Cl. .................................... 430/270.1; 430/913
(58) Field of Classification Search ............. 430/270.1, 430/130
See application file for complete search history.

(56) References Cited

U.S. PATENT DOCUMENTS

| | | | | |
|---|---|---|---|---|
| 2002/0192593 A1* | 12/2002 | Nagai et al. | ............... | 430/270.1 |
| 2003/0113660 A1* | 6/2003 | Yoneda et al. | ........... | 430/270.1 |
| 2004/0166432 A1* | 8/2004 | Ohsawa et al. | .............. | 430/170 |
| 2005/0244747 A1* | 11/2005 | Nagai et al. | ............... | 430/270.1 |
| 2006/0078821 A1* | 4/2006 | Shimizu et al. | .......... | 430/270.1 |
| 2006/0166138 A1* | 7/2006 | Shimizu et al. | .......... | 430/270.1 |

FOREIGN PATENT DOCUMENTS

| | | |
|---|---|---|
| EP | 1 238 972 A1 | 9/2002 |
| JP | 07-138249 | 5/1995 |
| JP | 07-319163 | 12/1995 |
| JP | 2001-075283 | 3/2001 |
| JP | 2004-219963 | 8/2004 |
| JP | 2004219963 A * | 8/2004 |

* cited by examiner

*Primary Examiner*—Amanda C. Walke
(74) *Attorney, Agent, or Firm*—Morris, Manning & Martin, LLP; Christopher W. Raimund

(57) ABSTRACT

A positive type radiation-sensitive resin composition suitable as a chemically-amplified resist sensitive to active radiation particularly to deep ultraviolet rays represented by a KrF excimer laser, an ArF excimer laser, or an $F_2$ excimer laser, excelling particularly in a process margin for the KrF excimer laser is provided. The positive type radiation-sensitive resin composition comprises a photoacid generator and an acid-labile group-containing resin which is insoluble or scarcely soluble in alkali, but becomes alkali-soluble by the action of an acid, wherein the photoacid generator is a mixed photoacid generator containing a photoacid generator of the following formula (1) and a photoacid generator which is at least one compound selected from sulfonyloxyimide and disulfonyl-diazomethane.

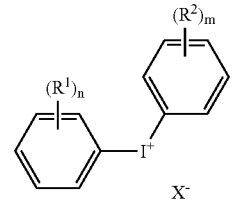

(1)

23 Claims, No Drawings

POSITIVE TYPE RADIATION-SENSITIVE RESIN COMPOSITION

BACKGROUND OF THE INVENTION

The present invention relates to a positive type radiation-sensitive resin composition and, particularly, to a positive type radiation-sensitive resin composition suitable as a chemically-amplified resist useful for microfabrication utilizing various types of radiation, for example, deep ultraviolet rays such as a KrF excimer laser or ArF excimer laser, X-rays such as synchrotron radiation, or charged particle rays such as electron beams.

In the field of microfabrication represented by fabrication of integrated circuit devices, lithographic technology enabling microfabrication with a line width level of 0.20 μm or less has been demanded in recent years in order to achieve a higher degree of integration.

A conventional lithographic process utilizes near ultraviolet rays such as an i-line radiation. It is known in the art that microfabrication with a line width of a sub-quarter micron order using near ultraviolet rays is very difficult.

Use of radiation with a shorter wavelength has been studied for enabling microfabrication with a line width level of 0.20 μm or less. As the radiation with a shorter wavelength, deep ultraviolet rays such as a bright line spectrum of a mercury lamp and an excimer laser, X-rays, an electron beams, and the like can be given, for example. Of these, a KrF excimer laser (wavelength: 248 nm), an ArF excimer laser (wavelength: 193 nm), an $F_2$ excimer laser (wavelength: 157 nm), and the like are gaining attention. As a radiation-sensitive resin composition applicable to irradiation (hereinafter called "exposure") by the excimer laser, a number of chemically-amplified radiation-sensitive resin compositions utilizing a chemical amplification effect brought about by a component having an acid-labile functional group and a photoacid generator which generates an acid upon exposure have been proposed.

The chemically-amplified radiation-sensitive resin composition utilizes the effect of the resin being insoluble or scarcely soluble in alkali by itself, but becoming alkali-soluble by the action of an acid, and the resin to dissociate an acid-labile group in the copolymer by the action of an acid generated from the photoacid generator upon exposure to form an acidic group such as a carboxyl group or a phenolic hydroxyl group, which renders an exposed area on a resist film readily soluble in an alkaline developer.

Along with a rapid miniaturization trend of photolithography process, limit of resolution is close to less than half the light wavelength in the recent KrF photolithography process. Characteristics demanded for a positive type radiation-sensitive resin composition as a photo resist are becoming severer, especially increase in process margin is demanded.

Photoacid generators introducing a fluorine atom into a cation part of molecules are disclosed for increasing resolution of KrF excimer laser resist and EB resist (JP-B-3215562, JP-A-2001-75283 and JP-B-3082892).

Further, as a radiation sensitive resin composition excelling in a process margin particularly for KrF excimer laser, a radiation sensitive resin composition using a mixed photoacid generator comprising a photoacid generator having substituted group containing fluorine atoms and a predetermined photoacid generator is disclosed (JP-A-2004-219963).

However, to achieve a higher degree of integration in the field of semiconductor, focal depth allowance, resolution and pattern profile remain insufficient if only the photoacid generator which a fluorine atom introduced into a cation part is used. In addition, even if a mixed photoacid generator is used, the photoacid generator other such as sulfonamide results in pattern collapse depending on the photoacid generator.

Further, it is difficult to adjustment for the fabrication of semiconductor devices which are expected to become more miniaturized.

SUMMARY OF THE INVENTION

An object of the present invention is to provide a radiation-sensitive resin composition excelling particularly in a process margin for the KrF excimer laser. The composition can be used as a chemically amplified resist sensitive to active radiation particularly to deep ultraviolet rays represented by a KrF excimer laser, an ArF excimer laser, or an $F_2$ excimer laser.

A positive type radiation-sensitive resin composition of the present invention comprises (A) a photoacid generator and (B) an acid-labile group-containing resin which is insoluble or scarcely soluble in alkali, but becomes alkali-soluble by the action of an acid.

(A) the photoacid generator comprises a mixed photoacid generator containing (A1) a photoacid generator of the following formula (1) and (A2) a photoacid generator which is at least one compound selected from the group consisting of sulfonyloxyimides and disulfonyldiazomethanes,

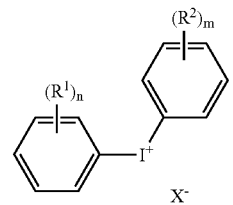

wherein $R^1$ represents a same or different monovalent organic group containing fluorine atoms, or a fluorine atom, $R^2$ represents a same or different monovalent organic group containing no fluorine atoms, or a hydrogen atom, n and m are integers of 1-5, and $X^-$ represents an anion of camphorsulfonic acid or nonafluorobutanesulfonic acid.

(B) the acid-labile group-containing resin comprises a recurring unit of the following formula (2),

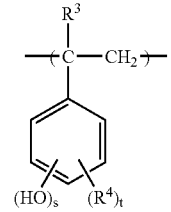

wherein $R^3$ represents a hydrogen atom or a methyl group, $R^4$ represents a monovalent organic group, two or more $R^4$ individually represent same or different, s is an integer of 1-3, and t is an integer of 0-3, provided that $s+t \leq 5$.

(B) the acid-labile group-containing resin further comprises a recurring unit which is at least one recurring unit selected from a recurring unit of the following formula (3) and a recurring unit of the following formula (4),

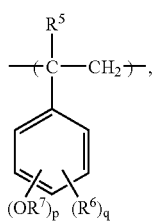

(3)

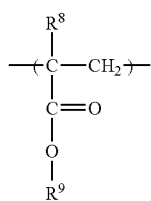

(4)

wherein $R^5$ represents a hydrogen atom or a methyl group, $R^6$ represents a monovalent organic group, $R^7$ represents a monovalent acid-labile group, p is an integer of 1-3, q is an integer of 0-3, provided that $p+q \leq 5$ of the formula (3), $R^8$ represents a hydrogen atom or a methyl group, and $R^9$ represents t-butyl group, 1-methylcyclopentyl group or 1-ethylcyclopentyl group of the formula (4).

The positive type radiation-sensitive resin composition of the present invention comprises (E) an additive which is a compound at least one compound selected from a carbazole compound and an anthracene compound with (A) the photoacid generator and (B) the acid-labile group-containing resin.

The mixed photoacid generator containing a photoacid generator (A1) represented by the formula (1) and a photoacid generator (A2) which is at least one compound selected from sulfonyloxyimides and disulfonyldiazomethanes as the photoacid generator (A) exhibits high destruction efficiency when the photoacid generator is exposed with deep ultraviolet rays or electron beams. An aromatic ring having a monovalent organic group containing fluorine atoms as a substituted group considerably increases hydrophobicity of the generator.

Therefore, the photoacid generator interacts with the acid-labile group-containing resin in the positive type radiation-sensitive resin composition consisted of a resist matrix, and reduces the dissolution rate, in an alkaline developer, namely, improves dissolution inhibitory effect as the resist film. As a result, difference of rate of dissolution to the developer between exposed area and non-exposed area becomes larger, the composition exhibits high resolution, particularly, excels in a process margin for the KrF excimer laser. Thus, an excellent pattern profile, which has no pattern collapse and exhibits high resolution, can be obtained.

DETAILED DESCRIPTION OF THE PREFERRED EMBODIMENTS

The photoacid generator (A1) is described below in detail.

In the photoacid generator (A1) of the formula (1), $R^1$ represents a monovalent organic group containing fluorine atoms, or a fluorine atom.

As examples of $R^1$, fluoroalkyl groups having 1-6 carbon atoms such as a trifluoromethyl group and nonafluorobutyl group; a fluorine atom, and the like can be given. Of these, the fluorine atom is preferable.

$R^2$ represents a monovalent organic group containing no fluorine atoms or a hydrogen atom. As examples of $R^2$, alkyl groups having 1-6 carbon atoms such as a methyl group, ethyl group, propyl group, and butyl group; a hydrogen atom, and the like can be given. Of these, the hydrogen atom and the methyl group are preferable.

n and m are integers of 1-5 respectively, and preferably n=1 and m=1.

$X^-$ represents an anion of camphorsulfonic acid or nonafluorobutanesulfonic acid. Thus, the $X^-$ indicates an anion component of the sulfonic acid.

The photoacid generator (A2) is described below in detail.

As an example of the sulfonyloxyimide in the present invention, a compound of the following formula (5) can be given;

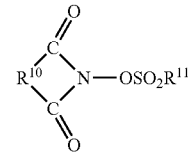

(5)

wherein $R^{11}$ is a monovalent organic group and $R^{10}$ is a divalent organic group.

As the monovalent organic group, a substituted or unsubstituted linear or branched alkyl group, substituted or unsubstituted cyclic alkyl group, substituted or unsubstituted aryl group, perfluoroalkyl group, and the like can be given. As the divalent organic group, a substituted or unsubstituted alkylene group, substituted or unsubstituted alkenylene group, substituted or unsubstituted phenylene group, and the like can be given.

As specific examples of the sulfonyloxyimide, N-(trifluoromethylsulfonyloxy) succinimide, N-(trifluoromethylsulfonyloxy)bicyclo[2.2.1]hept-5-ene-2,3-dicarboxyimide, N-(10-camphorsulfonyloxy) succinimide, N-(10-camphorsulfonyloxy)bicyclo[2.2.1]hept-5-ene-2,3-dicarboxyimide, N-(10-camphorsulfonyloxy)-7-oxabicyclo[2.2.1]hept-5-ene-2,3-dicarboxyimide, N-(4-methylphenylsulfonyloxy) succinimide, N-(4-methylphenylsulfonyloxy)bicyclo[2.2.1] hept-5-ene-2,3-dicarboxyimide, N-(4-trifluoromethylphenylsulfonyloxy)succinimide, N-(4-trifluoromethylphenylsulfonyloxy) bicyclo[2.2.1]hept-5-ene-2,3-dicarboxyimide, N-(perfluorophenylsulfonyloxy) succinimide, N-(perfluorophenylsulfonyloxy)bicyclo[2.2.1] hept-5-ene-2,3-dicarboxyimide, N-(nonafluorobutylsulfonyloxy)succinimide, N-(nonafluorobutylsulfonyloxy)bicyclo[2.2.1]hept-5-ene-2,3-dicarboxyimide, N-(perfluorooctylsulfonyloxy)succinimide, N-(perfluorooctylsulfonyloxy)bicyclo[2.2.1]hept-5-ene-2,3-dicarboxyimide, N-(phenylsulfonyloxy)succinimide, N-(phenylsulfonyloxy)bicyclo[2.2.1]hept-5-ene-2,3-dicarboxyimide, N-(phenylsulfonyloxy)-7-oxabicyclo[2.2.1] hept-5-ene-2,3-dicarboxyimide, N-{(5-methyl-5-carboxymethyl bicyclo[2.2.1]heptane-2-yl)sulfonyloxy}succinimide, and the like can be given. These sulfonyloxyimides can be used either individually or in combinations of two or more.

Of these sulfonyloxyimides, N-(trifluoromethylsulfonyloxy)bicyclo[2.2.1]hept-5-ene-2,3-dicarboxyimide, N-(10-camphorsulfonyloxy) succinimide, N-(4-methylphenylsulfonyloxy) succinimide, N-(nonafluorobutylsulfonyloxy) bicyclo[2.2.1]hept-5-ene-2,3-dicarboxyimide, N-(phenylsulfonyloxy)bicyclo[2.2.1]hept-5-ene-2,3-dicarboxyimide, and N-{(5-methyl-5-carboxymethyl bicyclo [2.2.1]heptane-2-yl)sulfonyloxy}succinimide are preferable.

As an example of disulfonyldiazomethane, a compound of the following formula (6) can be given,

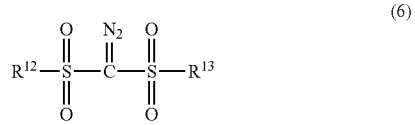

(6)

wherein $R^{12}$ and $R^{13}$ individually represent same or different, a monovalent group such as an alkyl group, an aryl group, a halogenated alkyl group, a halogenated aryl group, and the like.

As the alkyl group, a linear or branched alkyl group having 1-6 carbon atoms and a cyclic alkyl group having 6-25 carbon atoms can be given. As the aryl group, a substituted or unsubstituted phenyl group having 6-10 carbon atoms and a naphthyl group having 10-20 carbon atoms can be given. As the halogenated alkyl group, a fluorine substituted alkyl group can be given. As the halogenated aryl group, a fluorine substituted aryl group can be given.

As specific examples of the disulfonyldiazomethane of the formula (6), bis(trifluoromethylsulfonyl)diazomethane, bis(cyclohexylsulfonyl)diazomethane, bis(phenylsulfonyl)diazomethane, bis(4-methylphenylsulfonyl)diazomethane, bis(3,3-dimethyl-1,5-dioxaspiro[5,5]dodecane-8-sulfonyl) diazomethane, bis(t-butylsulfonyl) diazomethane, bis(2,4-dimethylphenylsulfonyl) diazomethane, bis(4-t-butylphenylsulfonyl) diazomethane, bis(4-chlorophenylsulfonyl) diazomethane, methylsulfonyl-4-methylphenylsulfonyl diazomethane, cyclohexylsulfonyl-4-methylphenylsulfonyl diazomethane, cyclohexylsulfonyl-1,1-dimethylethylsulfonyl diazomethane, bis(1,1-dimethylethylsulfonyl) diazomethane, bis(1-methylethylsulfonyl) diazomethane, bis(1,4-dioxaspiro[4,5]decane-7-sulfonyl) diazomethane, and the like can be given. These disulfonyldiazomethanes can be used either individually or in combinations of two or more.

Of these disulfonyldiazomethanes, bis(cyclohexylsulfonyl) diazomethane, bis(3,3-dimethyl-1,5-dioxaspiro[5,5]dodecane-8-sulfonyl) diazomethane, bis(t-butylsulfonyl) diazomethane, bis(1-methylethylsulfonyl) diazomethane, and bis(1,4-dioxaspiro[4,5]decane-7-sulfonyl) diazomethane are preferable.

These sulfonyloxyimides and disulfonyldiazomethanes can be used either individually or in combination of two or more.

The mixed photoacid generator of the present invention contains a photoacid generator represented by the formula (1) (hereinafter referred to as "acid generator (A1)") and a photoacid generator represented by the formula (5) and/or the formula (6) (hereinafter referred to as "acid generator (A2)") as essential components. The weight proportion of the acid generator (A1) and the acid generator (A2) to be mixed (the acid generator (A1)/the acid generator (A2)) is from 100/1 to 1/100, preferably from 120/100 to 5/100, and still more preferably from 100/100 to 10/100. If the mixed proportion of the acid generator is out of the range from 100/1 to 1/100, process margin (focal depth allowance) and pattern profile tend to decrease.

The mixed acid generator can optionally be added acid generators other than the acid generator (hereinafter referred to as "other acid generators"). As the other acid generator, onium salt, sulfone compound, sulfonic acid ester compound, oximesulfonate compound, hydrazinesulfonate compound, and the like can be given.

Of these acid generators, onium salt is preferable. As the onium salt, for example, iodonium salt, sulfonium salt, phosphonium salt, diazonium salt, ammonium salt, pyridinium salt, and the like can be given.

As specific examples of the onium salt compound, bis(4-t-butylphenyl)iodonium nonafluorobutanesulfonate, bis(4-t-butylphenyl)iodonium trifluoromethanesulfonate, bis(4-t-butylphenyl)iodonium perfluorooctanesulfonate, bis(4-t-butylphenyl)iodonium p-toluenesulfonate, bis(4-t-butylphenyl)iodonium 10-camphorsulfonate, bis(4-t-butylphenyl)iodonium 4-trifluoromethylbenzenesulfonate, bis(4-t-butylphenyl)iodonium perfluorobenzenesulfonate, diphenyliodonium nonafluorobutanesulfonate, diphenyliodonium trifluoromethanesulfonate, diphenyliodonium perfluorooctanesulfonate, diphenyliodonium p-toluenesulfonate, diphenyliodonium benzenesulfonate, diphenyliodonium 10-camphorsulfonate, diphenyliodonium 4-trifluoromethylbenzenesulfonate, diphenyliodonium perfluorobenzenesulfonate, triphenylsulfonium nonafluorobutanesulfonate, triphenylsulfonium trifluoromethanesulfonate, triphenylsulfonium perfluorooctanesulfonate, triphenylsulfonium p-toluenesulfonate, triphenylsulfonium benzenesulfonate, triphenylsulfonium 10-camphorsulfonate, triphenylsulfonium 4-trifluoromethylbenzenesulfonate, triphenylsulfonium perfluorobenzenesulfonate, 4-hydroxyphenyl diphenylsulfonium trifluoromethanesulfonate, tris(p-methoxyphenyl)sulfonium nonafluorobutanesulfonate, tris(p-methoxyphenyl)sulfonium trifluoromethanesulfonate, tris(p-methoxyphenyl)sulfonium perfluorooctanesulfonate, tris(p-methoxyphenyl)sulfonium p-toluenesulfonate, tris(p-methoxyphenyl)sulfonium benzenesulfonate, tris(p-methoxyphenyl)sulfonium 10-camphorsulfonate, (p-fluorophenyl)(phenyl)iodonium trifluoromethanesulfonate, and the like can be given.

In the present invention, the amount of the acid generator to be added is usually from 0.1 to 20 parts by weight, preferably from 0.5 to 15 parts by weight, and more preferably from 1 to 15 parts by weight for 100 parts by weight of an acid-labile group-containing resin described below. If the amount of the acid generator is less than 0.1 parts by weight, effects of the present invention can be difficult to obtain. If the amount exceeds 20 parts by weight, heat resistance as a positive type radiation-sensitive resin composition tend to decrease.

The acid-labile group-containing resin (B) is described below in detail.

The acid-labile group-containing resin (B) of the present invention is a resin which is insoluble or scarcely soluble in alkali, but becomes alkali-soluble when the acid-labile group dissociates.

In the present invention, "insoluble or scarcely soluble in alkali" means that 50% or more of the initial film thickness of a resist film remains after development when the resist film formed from the acid-labile group-containing resin (B) alone is developed under the same alkaline development conditions for forming a resist pattern using a resist film formed from a radiation-sensitive resin composition comprising the acid-labile group-containing resin (B) and an acid generator.

As the acid-labile group-containing resin (B), a resin that is insoluble or scarcely soluble in alkali by itself, and is obtainable from an alkali-soluble resin containing one or more acid functional groups such as a phenolic hydroxyl group or carboxyl group by replacing one or more hydrogen atoms in the acid functional groups with acid-labile groups can be given.

As a preferable example of the acid-labile group-containing resin (B) in the present invention, a resin having a recurring unit of the following formula (2) (hereinafter referred to as "recurring unit (2)"), recurring unit of the following formula (3) (hereinafter referred to as "recurring unit (3)") and/or a recurring unit of the following formula (4) (hereinafter referred to as "recurring unit (4)") can be given.

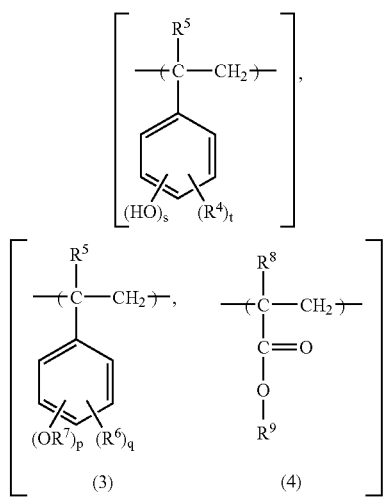

In the formula (2), $R^3$ represents a hydrogen atom or a methyl group, $R^4$ represents a monovalent organic group (excluding the group same as —$OR^7$ in the formula (3)), s is an integer of 1-3, and t is an integer of 0-3, provided that $s+t \leq 5$. And two or more $R^4$ individually represent same or different.

In the formula (3), $R^5$ represents a hydrogen atom or a methyl group, $R^6$ represents a monovalent organic group (excluding the group same as —$OR^7$ in the formula (3)), $R^7$ represents a monovalent acid-labile group, p is an integer of 1-3, and q is an integer of 0-3, provided that $p+q \leq 5$. In the formula (4), $R^8$ represents a hydrogen atom or a methyl group, and $R^9$ represents t-butyl group, 1-methylcyclopentyl group or 1-ethylcyclopentyl group.

As examples of the monovalent organic group represented by $R^4$ in the formula (2) and $R^6$ in the formula (3), linear, branched, or cyclic alkyl groups having 1-12 carbon atoms, monovalent aromatic hydrocarbon groups having 6-20 carbon atoms, monovalent oxygen-containing organic groups, monovalent nitrogen-containing organic groups, and the like can be given.

As examples of the alkyl groups, a methyl group, ethyl group, n-propyl group, i-propyl group, n-butyl group, 2-methylpropyl group, 1-methylpropyl group, t-butyl group, cyclopentyl group, cyclohexyl group, and the like can be given.

As examples of the monovalent aromatic hydrocarbon groups, a phenyl group, o-tolyl group, m-tolyl group, p-tolyl group, 2,4-xylyl group, 2,6-xylyl group, 3,5-xylyl group, mesityl group, o-cumenyl group, m-cumenyl group, p-cumenyl group, benzyl group, phenethyl group, 1-naphthyl group, 2-naphthyl group, and the like can be given.

As examples of the monovalent oxygen-containing organic groups, a carboxyl group; linear, branched, or cyclic hydroxyalkyl groups having 1-8 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, 4-hydroxybutyl group, 3-hydroxycyclopentyl group, and 4-hydroxycyclohexyl group; linear, branched, or cyclic alkoxyl groups having 1-8 carbon atoms such as a methoxy group, ethoxy group, n-propoxy group, i-propoxy group, n-butoxy group, 2-methylpropoxy group, 1-methylpropoxy group, t-butoxy group, cyclopentyloxy group, and cyclohexyloxy group; linear alkoxycarbonyloxy groups having 2-9 carbon atoms such as a methoxycarbonyloxy group, ethoxycarbonyloxy group, n-propoxycarbonyloxy group, and n-butoxycarbonyloxy group; linear, branched, or cyclic (1-alkoxyalkoxy)alkyl groups having 3-11 carbon atoms such as a (1-methoxyethoxy)methyl group, (1-ethoxyethoxy)methyl group, (1-n-propoxyethoxy) methyl group, (1-n-butoxyethoxy)methyl group, (1-cyclopentyloxyethoxy)methyl group, (1-cyclohexyloxyethoxy) methyl group, (1-methoxypropoxy)methyl group, and (1-ethoxypropoxy)methyl group; linear, branched, or cyclic alkoxycarbonyloxyalkyl groups having 3-10 carbon atoms such as a methoxycarbonyloxymethyl group, ethoxycarbonyloxymethyl group, n-propoxycarbonyloxymethyl group, i-propoxycarbonyloxymethyl group, n-butoxycarbonyloxymethyl group, t-butoxycarbonyloxymethyl group, cyclopentyloxycarbonyloxymethyl group, and cyclohexyloxycarbonyloxymethyl group; and the like can be given.

As examples of the monovalent nitrogen-containing organic groups, a cyano group; linear, branched, or cyclic cyanoalkyl groups having 2-9 carbon atoms such as a cyanomethyl group, 1-cyanoethyl group, 2-cyanoethyl group, 1-cyanopropyl group, 2-cyanopropyl group, 3-cyanopropyl group, 1-cyanobutyl group, 2-cyanobutyl group, 3-cyanobutyl group, 4-cyanobutyl group, 3-cyanocyclopentyl group, and 4-cyanocyclohexyl group; and the like can be given.

As examples of the monovalent acid-labile group represented by $R^7$ in the formula (3), a substituted methyl group, 1-substituted ethyl group, 1-branched alkyl group, triorganosilyl group, triorganogermyl group, alkoxycarbonyl group, acyl group, monovalent cyclic acid-labile group, and the like can be given.

As examples of the substituted methyl group, a methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and the like can be given.

As examples of the 1-substituted ethyl group, a 1-methoxyethyl group, 1-methylthioethyl group, 1,1-dimethoxyethyl group, 1-ethoxyethyl group, 1-ethylthioethyl group, 1,1-diethoxyethyl group, 1-ethoxypropyl group, 1-propoxyethyl group, 1-cyclohexyloxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-isopropoxycarbonylethyl group, 1-n-butoxycarbonylethyl group, 1-t-butoxycarbonylethyl group, and the like can be given.

As examples of the 1-branched alkyl group, an i-propyl group, sec-butyl group, t-butyl group, 1,1-dimethylpropyl group, 1-methylbutyl group, 1,1-dimethylbutyl group, and the like can be given.

As examples of the triorganosilyl group, a trimethylsilyl group, ethyldimethylsilyl group, methyldiethylsilyl group, triethylsilyl group, i-propyldimethylsilyl group, methyldi-1-propylsilyl group, tri-1-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like can be given.

As examples of the triorganogermyl group, a trimethylgermyl group, ethyldimethylgermyl group, methyldiethylgermyl group, triethylgermyl group, isopropyldimethylgermyl group, methyldi-1-propylgermyl group, tri-1-propylgermyl group, t-butyldimethylgermyl group, methyldi-t-butylgermyl group, tri-t-butylgermyl group, phenyldimethylgermyl group, methyldiphenylgermyl group, triphenylgermyl group, and the like can be given.

As examples of the alkoxycarbonyl group, a methoxycarbonyl group, ethoxycarbonyl group, i-propoxycarbonyl group, t-butoxycarbonyl group, and the like can be given.

As examples of the acyl group, an acetyl group, propionyl group, butyryl group, heptanoyl group, hexanoyl group, valeryl group, pivaloyl group, isovaleryl group, lauroyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of the monovalent cyclic acid-labile group, a cyclopropyl group, cyclopentyl group, cyclohexyl group, cyclohexenyl group, 4-methoxycyclohexyl group, tetrahydrofuranyl group, tetrahydropyranyl group, tetrahydrothiofuranyl group, tetrahydrothiopyranyl group, 3-bromotetrahydropyranyl group, 4-methoxytetrahydropyranyl group, 4-methoxytetrahydrothiopyranyl group, 3-tetrahydrothiophene-1,1-dioxide group, and the like can be given.

Of these monovalent acid-labile groups, a t-butyl group, benzyl group, 1-methoxyethyl group, 1-ethoxyethyl group, trimethylsilyl group, t-butoxycarbonyl group, t-butoxycarbonylmethyl group, tetrahydrofuranyl group, tetrahydropyranyl group, tetrahydrothiofuranyl group, tetrahydrothiopyranyl group, and the like are preferable.

As examples of preferable recurring units (2) in the present invention, units obtainable by cleavage of a polymerizable unsaturated bond such as 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6-trihydroxystyrene, and the like can be given.

The recurring units (2) can be used in the resin (B) either individually or in combination of two or more.

As examples of preferable recurring units (3) in the present invention, units obtainable by cleavage of a polymerizable unsaturated bond such as 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, and the like can be given.

The recurring units (3) can be used in the resin (B) either individually or in combination of two or more.

As examples of recurring units (4) in the present invention, t-butyl(meth)acrylate, 1-methylcyclopentyl(meth)acrylate and 1-ethylcyclopentyl (meth)acrylate are preferable.

The recurring units (4) can be used in the resin (B) either individually or in combination of two or more.

The resin (B) can further comprise recurring units other than the recurring units (2), the recurring units (3) and the recurring units (4) (hereinafter referred to as "other recurring units").

The other recurring units include units obtainable by cleavage of a polymerizable unsaturated bond of monomers such as, for example, vinyl aromatic compounds such as styrene, α-methylstyrene, 2-methylstyrene, 3-methylstyrene, 4-methylstyrene, 2-methoxystyrene, 3-methoxystyrene, 4-methoxystyrene, and 4-(2-t-butoxycarbonylethyloxy)styrene; (meth) acrylic esters such as methyl (meth)acrylate, ethyl(meth)acrylate, n-propyl(meth)acrylate, i-propyl(meth)acrylate, n-butyl(meth)acrylate, 2-methylpropyl(meth)acrylate, 1-methylpropyl(meth)acrylate, n-pentyl(meth)acrylate, neopentyl (meth)acrylate, n-hexyl(meth)acrylate, 2-ethylhexyl(meth) acrylate, 2-hydroxyethyl(meth)acrylate, 2-hydroxy-n-propyl (meth)acrylate, 3-hydroxy-n-propyl(meth)acrylate, phenyl (meth)acrylate, benzyl(meth)acrylate, 1-methyladamantyl (meth)acrylate, 1-ethyladamantyl (meth)acrylate, 8-methyl-8-tricyclodecyl(meth)acrylate, 8-ethyl-8-tricyclodecyl (meth)acrylate, 3-methyl-3-tetracyclododecenyl(meth)acrylate, 3-ethyl-3-tetracyclododecenyl(meth)acrylate, and 2,5-dimethylhexane-2,5-di(meth)acrylate; unsaturated carboxylic acids such as (meth)acrylic acid, crotonic acid, maleic acid, maleic anhydride, fumaric acid, and cinnamic acid; carboxyalkyl esters of unsaturated carboxylic acids such as 2-carboxyethyl(meth)acrylate, 2-carboxy-n-propyl(meth) acrylate, and 3-carboxy-n-propyl(meth)acrylate; unsaturated nitryl compounds such as (meth)acrylonitrile, α-chloroacrylonitrile, crotonitrile, maleinitrile, and fumaronitrile; unsaturated amide compounds such as (meth)acrylamide, N,N-dimethyl(meth)acrylamide, crotonamide, maleinamide, and fumaramide; unsaturated imide compounds such as maleimide, N-phenylmaleimide, and N-cyclohexylmaleimide; and other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole; can be given.

The other recurring units can be used in the resin (B) either individually or in combination of two or more.

In the present invention, 4-hydroxystyrene/4-t-butoxystyrene copolymer, 4-hydroxystyrene/4-t-butoxystyrene/1-methylcyclopentyl acrylate copolymer, 4-hydroxystyrene/4-t-butoxystyrene/1-ethylcyclopentyl acrylate copolymer, 4-hydroxystyrene/4-t-butoxystyrene/styrene copolymer, 4-hydroxystyrene/t-butyl acrylate/styrene copolymer, 4-hydroxystyrene/1-methylcyclopentyl acrylate/styrene copolymer, 4-hydroxystyrene/1-ethylcyclopentyl acrylate/styrene copolymer, 4-hydroxystyrene/4-t-butoxystyrene/2,5-dimethylhexane-2,5-diacrylate copolymer, 4-hydroxystyrene/t-butyl acrylate/4-t-butoxystyrene copolymer, 4-hydroxystyrene/4-t-butoxystyrene/2,5-dimethylhexane-2,5-diacrylate/styrene copolymer, 4-hydroxystyrene/2,5-dimethylhexane-2,5-diacrylate/t-butyl acrylate copolymer, 4-hydroxystyrene/2,5-dimethylhexane-2,5-diacrylate/t-butyl acrylate/styrene copolymer, and the like are particularly preferable as the resin (B).

The amount of the acid-labile groups introduced into the acid-labile group-containing resin (B) (the amount of the number of the acid-labile groups in the total number of non-protected acid functional groups and acid-labile groups in the acid-labile group-containing resin (B)) is preferably 10-100%, and still more preferably 15-100%, although the amount varies depending on the types of acid-labile groups and the alkali-soluble resin into which the acid-labile groups are introduced.

In the resin (B), the amount of the recurring unit (2) is preferably 60-80 mol %, and more preferably 65-75 mol %, the amount of the recurring unit (3) is preferably 15-40 mol %, and more preferably 20-35 mol %, the amount of the recurring unit (4) is preferably 10-40 mol %, and more preferably 10-30 mol %, and the amount of the other recurring unit is usually 25 mol % or less, and preferably 10 mol % or less. If the amount of the recurring unit (2) is less than 60 mol %, adhesion of resist patterns to substrates tends to decrease; if more than 80 mol %, contrast after development tends to decrease. If the total amount of the recurring unit (3) and the recurring unit (4) is less than 20 mol %, resolution tends to decrease. If the amount of the recurring unit (3) is more than 40 mol %, adhesion of resist patterns to substrates tends to decrease. If the amount of the recurring unit (4) is more than 40 mol %, dry etching resistance may be decreased. If the amount of the other recurring unit is more than 25 mol %, resolution tends to decrease.

The polystyrene-reduced weight molecular weight (hereinafter referred to as "Mw") of the acid-labile group-containing resin (B) determined by gel permeation chromatography (GPC) is preferably 1,000-150,000, and more preferably 3,000-100,000.

The ratio of Mw to the polystyrene-reduced number molecular weight (hereinafter referred to as "Mn") determined by gel permeation chromatography (Mw/Mn) of the acid-labile group-containing resin (B) is usually 1-10, and preferably 1-5.

The acid-labile group-containing resin (B) can be manufactured by polymerizing a polymerizable unsaturated monomer corresponding to the recurring unit (2), optionally together with a polymerizable unsaturated monomer providing other recurring unit, and introducing one or more monovalent acid-labile groups ($R^7$) into the phenolic hydroxyl group of the polymer. The resin (B) can also be manufactured by copolymerizing a polymerizable unsaturated monomer corresponding to the recurring unit (2) and a polymerizable unsaturated monomer corresponding to the recurring unit (3), optionally together with a polymerizable unsaturated monomer providing other recurring unit.

In the present invention, the acid-labile group-containing resin (B) can be used either individually or in combination of two or more.

It is preferable to add alkali-soluble resins, acid diffusion controllers, and other additives to the positive type radiation-sensitive resin composition of the present invention.

Examples of the alkali-soluble resin include poly(p-hydroxystyrene), partially hydrogenated poly(p-hydroxystyrene), poly(m-hydroxystyrene), (p-hydroxystyrene)-(m-hydroxystyrene) copolymer, (p-hydroxystyrene)-(styrene) copolymer, novolac resin, polyvinyl alcohol, polyacrylic acid, and the like. The Mw of the resin is 1,000-1,000,000, preferably 2,000-100,000. The alkali-soluble resins can be used either individually or in combinations of two or more.

The acid diffusion controllers control diffusion of an acid generated from the acid generator upon exposure in the resist film to suppress undesired chemical reactions in the non-exposed area. Addition of the acid diffusion controller further improves storage stability of the resulting composition and resolution of the resist. Moreover, the addition of the acid diffusion controller prevents the line width of the resist pattern from changing due to changes in the post-exposure delay (PED), whereby a composition with remarkably superior process stability can be obtained.

As the acid diffusion controller, nitrogen-containing organic compounds of which the basicity does not change during exposure or heating when forming a resist pattern are preferable.

As examples of the nitrogen-containing organic compound, a compound of the following formula (10) (hereinafter referred to as "nitrogen-containing compound (I)"), a diamino compound having two nitrogen atoms in the molecule (hereinafter referred to as "nitrogen-containing compound (II)"), a diamino polymer having three or more nitrogen atoms (hereinafter referred to as "nitrogen-containing compound (III)"), amide group-containing compounds, urea compounds, and nitrogen-containing heterocyclic compounds can be given.

(10)

wherein $R^{14}$ individually represent same or different, a hydrogen atom, an alkyl group, an aryl group, and aralkyl group, which can be substituted by functional group such as a hydroxyl group, for a hydrogen atom of the alkyl group, the aryl group, and the aralkyl group.

As examples of the nitrogen-containing compound (I), monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; alkanolamines such as an ethanolamine, diethanolamine, and triethanolamine; aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine; and the like can be given.

As examples of the nitrogen-containing compound (II), ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxylphenyl)propane, 2-(4-aminophenyl)-2-(4-hydroxylphenyl)propane, 1,4-bis[1-(4-aminophenyl)-1-methylethyl]benzene, 1,3-bis[1-(4-aminophenyl)-1-methylethyl]benzene, and the like can be given.

As examples of the nitrogen-containing compound (III), polyethyleneimine, polyallylamine, polymer of dimethylaminoethyl acrylamide, and the like can be given.

As examples of the amide group-containing compounds, formamide, N-methylformamide, N,N-dimethylformamide, acetamide, N-methylacetamide, N,N-dimethylacetamide, propionamide, benzamide, pyrrolidone, N-methylpyrrolidone, and the like can be given.

As examples of the urea compounds, urea, methylurea, 1,1-dimethylurea, 1,3-dimethylurea, 1,1,3,3-tetramethylurea, 1,3-diphenylurea, tributylthiourea, and the like can be given.

As examples of the nitrogen-containing heterocyclic compounds, imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine; and pyrazine, pyrazole, pyridazine, quinoxaline, purine, pyrrolidine, piperidine, morpholine, 4-methylmorpholine, piperazine, 1,4-dimethylpiperazine, and 1,4-diazabicyclo[2.2.2]octane, and the like can be given.

Base precursors having acid-labile group can be added as acid diffusion controller. Examples of the base precursors, N-(t-butoxycarbonyl)piperidine, N-(t-butoxycarbonyl)imidazole, N-(t-butoxycarbonyl)benzimidazole, N-(t-butoxycarbonyl) 2-phenylbenzimidazole, N-(t-butoxycarbonyl) dioctylamine, N-(t-butoxycarbonyl) diethanolamine, N-(t-butoxycarbonyl) dicyclohexylamine, N-(t-butoxycarbonyl) diphenylamine, and the like can be given.

Of these nitrogen-containing organic compounds, the nitrogen-containing compounds (I) and nitrogen-containing heterocyclic compounds are preferable. Among the nitrogen-containing compounds (I), trialkylamines and alkanolamines are particularly preferable. Among the nitrogen-containing heterocyclic compounds, imidazoles are particularly preferable.

The acid diffusion controller can be used either individually or in combination of two or more.

The amounts of the acid diffusion controller to be added is usually 15 parts by weight or less, preferably 0.001-10 parts by weight, and still more preferably 0.005-5 parts by weight for 100 parts by weight of the acid-labile group-containing resin. If the amount of the acid diffusion controller exceeds 15 parts by weight, sensitivity as a resist and developability of the exposed area tend to decrease. If the amount is less than 0.001 parts by weight, the pattern profile or dimensional accuracy as a resist may decrease depending on the processing conditions.

Surfactants exhibiting an action of improving the applicability or striation of the composition and developability as resist can optionally be added to the positive type radiation-sensitive resin composition of the present invention.

As examples of the surfactant, polyoxyethylene lauryl ether, polyoxyethylene stearyl ether, polyoxyethylene oleyl ether, polyoxyethylene octyl phenol ether, polyoxyethylene nonyl phenol ether, polyethylene glycol dilaurate, polyethylene glycol distearate, and commercially available products such as FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.), KP341 (manufactured by Shin-Etsu Chemical Co., Ltd.), and POLYFLOW No. 75, No. 95 (manufactured by Kyoeisha Chemical Co., Ltd.) can be given.

The amount of surfactants to be added is usually two parts by weight or less for 100 parts by weight of the acid-labile group-containing resin.

At least one additive (E) is preferably added to the positive type radiation-sensitive resin composition selected from the group consisting of a carbazole compound and an anthracene compound. The additive (E) is dye component. As preferable examples of the additive (E), benzophenones, rose bengals, anthracenes, carbazoles, and the like can be given. Of these compounds, anthracenes and carbazoles are particularly preferable.

In the present invention, the benzophenones, rose bengals, anthracenes, and carbazoles can be used either individually or in combination of two or more.

As preferable examples of the anthracenes, anthracene-9-carboxylic acid methoxycarbonylmethyl, anthracene-9-carboxylic acid t-butoxycarbonylmethyl, 9-methoxycarbonylmethylanthracene, 9-t-butoxycarbonylmethylanthracene, anthracene-9-carboxylic acid, anthracene-9,10-dicarboxylic acid, 10-carboxymethylanthracene-9-carboxylic acid, 10-t-butoxycarbonylmethylanthracene-9-carboxylic acid, and the like can be given. Of these anthracenes, anthracene-9-carboxylic acid, anthracene-9,10-dicarboxylic acid and anthracene-9-carboxylic acid t-butoxycarbonylmethyl are particularly preferable.

As preferable examples of the carbazoles, carbazole derivatives such as N-(methoxycarbonylmethyl)carbazole, N-(t-butoxycarbonylmethyl)carbazole and 9-carbazoyl acetate; and the like can be given. Of these carbazoles, 9-carbazoyl acetate and N-(t-butoxycarbonylmethyl)carbazole are particularly preferable.

As examples of the benzophenones, benzophenone derivatives such as benzophenone-2-carboxylic acid t-butoxycarbonylmethyl and benzophenone-4-carboxylic acid t-butoxycarbonylmethyl; and the like can be given.

The amount of the additive (E) to be added is usually 50 parts by weight or less for 100 parts by weight of the acid-labile group-containing resin.

As examples of other additives, halation inhibitors such as 4-hydroxy-4'-methylchalcone, form improvers, storage stabilizers, anti-foaming agents, and the like can also be added.

When using, the positive type radiation-sensitive resin composition of the present invention is made into a composition solution by dissolving the composition in a solvent so that the total solid content is usually from 0.1 to 50 wt %, and preferably from 1 to 40 wt %, and filtering the solution using a filter with a pore diameter of about 200 nm, for example.

As examples of solvents used for preparation of the composition solution, ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3- methoxypropionate, butyl 3-methyl-3-methoxybutylate, methyl acetoacetate, ethyl acetoacetate, methylpyruvate, and ethyl pyruvate; aromatic hydrocarbons such as toluene, and xylene; ketones such as methyl ethyl ketone, methyl propyl ketone, methyl butyl ketone, 2-heptanone, 3-heptanone, 4-heptanone, and cyclohexanone; amides such as N-methylformamide, N,N-dimethylformamide, N-methylacetamide, N,N-dimethylacetamide, and N-methylpyrrolidone; lactones such as γ-butyrolactone, and the like can be given.

These solvents can be used either individually or in combination of two or more.

A resist pattern is formed from the positive type radiation-sensitive resin composition of the present invention by applying the composition solution prepared as mentioned above to substrates such as a silicon wafer and a wafer coated with aluminum using an appropriate application method such as spin coating, cast coating, and roll coating to form a resist film. The resist film is then optionally pre-baked (hereinafter called "PB") with temperature about 70° C. to 160° C. and exposed with radiation through a predetermined mask pattern. As the radiation, deep ultraviolet rays such as $F_2$ excimer laser (wavelength: 157 nm), ArF excimer laser (wavelength: 193 nm), and KrF excimer laser (wavelength: 248 nm), X-rays such as synchrotron radiation, or charged particle rays such as electron beams can be appropriately selected according to the types of acid generator. The exposure conditions such as radiation dosage are appropriately determined depending on the composition of the positive type radiation-sensitive resin composition, types of additives, and the like. Of these, deep ultraviolet rays such as KrF excimer laser (wavelength: 248 nm) and the like are preferable.

It is preferable in the present invention to perform post exposure bake (hereinafter called "PEB") with temperature at 70° C. to 160° C. for 30 seconds or more in order to stably form a highly-accurate minute pattern. If the temperature of the PEB is less than 70° C., sensitivity may fluctuate according to the type of substrates.

Then, the resist film was developed under the conditions at 10° C. to 50° C. for 10 to 200 seconds, preferably at 15° C. to 30° C. for 15 to 100 seconds, and more preferably at 20° C. to 25° C. for 15 to 90 seconds in an alkaline developer to form a specific resist pattern.

As the alkaline developer, an alkaline aqueous solution prepared by dissolving an alkali compound such as tetraalkyl ammonium hydroxides to a concentration of 1 to 10 wt %, preferably 1 to 5 wt %, and particularly preferably 1 to 3 wt %, for example, can be usually used.

A water-soluble organic solvent such as methanol, ethanol or the like, or a surfactant can be appropriately added to the developer such as the alkaline aqueous solution. When forming a resist pattern, a protection film can be provided on the resist film in order to prevent the effects of basic impurities and the like in an environmental atmosphere.

EXAMPLES

Reference Example 1

Synthesis of Acid-Labile Group-Containing Resin (B-1)

101 g of p-acetoxystyrene, 5 g of styrene, 42 g of p-t-butoxystyrene, 6 g of azobisisobutyronitrile (AIBN), and 1 g of t-dodecyl mercaptan were dissolved in 160 g of propylene glycol monomethyl ether. The mixture was polymerized while maintaining the temperature at 70° C. for 16 hours under nitrogen atmosphere. After the polymerization, the resulting solution was added dropwise to 2,000 g of n-hexane to coagulate the resin. Then, another 150 g of propylene glycol monomethyl ether was added to the resin. 300 g of methanol, 80 g of triethylamine, and 15 g of water were further added to the resin and hydrolyzed for 8 hours with refluxing at boiling point. After the reaction, the solvent and triethylamine were evaporated under reduced pressure. The resin was dissolved in acetone to be solid content of 20 wt %. The resulting resin solution was added dropwise to 2,000 g of water to coagulate the resin. The produced white powder was filtered and dried overnight at 50° C. under reduced pressure.

The resin was found to have Mw and Mw/Mn of 16,000 and 1.7 respectively. The result of $^{13}$C-NMR analysis confirmed that the copolymerization molar ratio of p-hydroxystyrene, styrene, and p-t-butoxystyrene of the copolymer was 72:5:23. This resin is referred to as "resin (B-1)".

The Mw and Mn of the resin (B-1) and the resins prepared in the following Reference Examples 2 and Reference Examples 3 were measured by gel permeation chromatography (GPC) using GPC columns (manufactured by Tosoh Corp., G2000H$_{XL}$×2, G3000H$_{XL}$×1, G4000H$_{XL}$×1) under the following conditions. Flow rate: 1.0 ml/minute, eluate: tetrahydrofuran, column temperature: 40° C., standard reference material: monodispersed polystyrene Reference Example 2

Synthesis of Acid-Labile Group-Containing Resin (B-2)

100 g of p-acetoxystyrene, 25 g of t-butyl acrylate, 18 g of styrene, 6 g of azobisisobutyronitrile (AIBN), and 1 g of t-dodecyl mercaptan were dissolved in 230 g of propylene glycol monomethyl ether. The mixture was polymerized while maintaining the temperature at 70° C. for 16 hours under nitrogen atmosphere. After the polymerization, the resulting solution was added dropwise to 2,000 g of n-hexane to coagulate the resin. Then, another 150 g of propylene glycol monomethyl ether was added to the resin. 300 g of methanol, 80 g of triethylamine, and 15 g of water were further added to the resin and hydrolyzed for 8 hours with refluxing at boiling point. After the reaction, the solvent and triethylamine were evaporated under reduced pressure. The resin was dissolved in acetone to be solid content of 20 wt %. The resulting resin solution was added dropwise to 2,000 g of water to coagulate the resin. The produced white powder was filtered and dried overnight at 50° C. under reduced pressure.

The resin was found to have Mw and Mw/Mn of 11,500 and 1.6 respectively. The result of $^{13}$C-NMR analysis confirmed that the copolymerization molar ratio of p-hydroxystyrene, t-butyl acrylate, and styrene of the resin was 61:19:20. This resin is referred to as "resin (B-2)".

Reference Example 3

Synthesis of Acid-Labile Group-Containing Resin (B-3)

25 g of a copolymer molar of p-hydroxystyrene and p-t-butoxystyrene (copolymerization molar ratio 90:10) was dissolved in 100 g of n-butyl acetate. Nitrogen gas was bubbled through the solution for 30 minutes. After the addition of 3.3 g of ethyl vinyl ether and 1 g of pyridinium p-toluenesulfonate as a catalyst, the mixture was reacted at room temperature for 12 hours. The resulting solution was added dropwise to 2,000 g of 1 wt % ammonium aqueous solution to coagulate the resin. The resin was filtered and dried overnight in a drier at 50° C. in the vacuum drying apparatus.

The resin was found to have Mw and Mw/Mn of 13,000 and 1.01 respectively. As a result of $^{13}$C-NMR analysis, the resin was found to have a structure in which 23 mol % of hydrogen atoms of the phenolic hydroxyl group in poly(p-hydroxystyrene) was replaced by ethoxyethyl groups, and 10 mol % by t-butyl groups. This resin is referred to as "resin (B-3)".

Reference Example 4

Synthesis of Acid-Labile Group-Containing Resin (B-4)

A solvent refluxed for six hours in the presence of sodium metal and after that distilled under nitrogen atmosphere was used. Monomers were used after bubbling dry nitrogen for one hour, followed by distillation. 37.6 g of p-ethoxyethoxystyrene, 11.0 g of p-t-butoxystyrene, and 1.4 g of styrene were dissolved in 200 g of cyclohexane. The solution was charged into a dried pressure resistant glass bottle and sealed with a crown cap with a hole having packing made of Neoprene (trade name of E.I. du Pont de Nemours and Company). After cooling the pressure resistant glass bottle to −20° C., 2.96 ml of n-butyllithium (1.83 mol/l cyclohexane solution) and 0.98 g of N,N,N',N'-tetramethylethylenediamine were added in this order. The mixture was reacted for one hour while maintaining the temperature at −20° C. Then, 1.0 g of methanol was added to terminate the reaction. The color of the reaction solution was confirmed to turn from red to colorless. After washing with 200 g of 3 wt % oxalic acid-water, 200 g of propylene glycol monomethyl ether and 1.5 g of p-toluenesulfonic acid were added. The mixture was stirred for three hours at room temperature (23-25° C.) to be hydrolyzed. The resulting copolymer solution was added dropwise to 2,000 g of water to coagulate the copolymer. The produced white powder was filtered and dried overnight at 50° C. under reduced pressure.

The copolymer was found to have Mw and Mw/Mn of 16,000 and 1.3 respectively. The result of $^{13}$C-NMR analysis confirmed that the copolymerization molar ratio of p-hydroxystyrene, styrene, and p-t-butoxystyrene of the copolymer was 72:5:23. This copolymer is referred to as "resin (B4)".

Examples 1 to 6 and Comparative Examples 1 to 2

The composition solutions were prepared by mixing the components in proportions shown in Table 1 and filtered the solution using a membrane filter with a pore diameter of 200 nm. In the Table 1, "part" refers to "part by weight".

"DUV42," manufactured by Brewer Science Corp. is applied to a silicon wafer with a 60 nm thickness by spin coating and baking with temperature at 205° C. for 60 seconds in the Clean Track ("ACT-8", manufactured by Tokyo Electron Ltd.).

Then, the composition solutions were applied to the silicon wafer by spin coating and baking under the PB conditions shown in Table 2, a resist coating with a thickness of 300 nm was formed.

Then, the coating was exposed using a Stepper S203B (manufactured by Nikon Corp., lens numerical aperture: 0.68, σ 0.75, ½ orbicular zone lightning) through 6% halftone mask, and performed PEB under the conditions shown in Table 2. After performing PEB, the resist film was developed at 23° C. for one minute in a 2.38 wt % tetramethylammonium hydroxide aqueous solution by puddling, washed with water, and dried to form a resist pattern. The evaluation results of the resist are shown in Table 2.

The following components were used in Examples and Comparative Examples. The additives (E) were used in Examples 7 to 10 and Comparative Example 3.

Acid Generator (A1) Represented by the Formula (1):
(A1-1): (p-fluorophenyl)(phenyl)iodonium10-camphorsulfonate
(A1-2): (p-fluorophenyl)(p-methylphenyl)iodonium nonafluorobutanesulfonate
(A1-3): (p-fluorophenyl)(phenyl)iodonium nonafluorobutanesulfonate Acid Generator (A2) of Sulfonyloxyimides and Disulfonyldiazomethanes:
(A2-1): N-(trifluoromethylsulfonyloxy)bicyclo[2.2.1]hept-5-ene-2,3-dicarboxyimide
(A2-2): N-(10-camphorsulfonyloxy) succinimide
(A2-3): Bis(cyclohexylsulfonyl) diazomethane.
(A2-4): N-{(5-methyl-5-carboxymethyl bicyclo[2.2.1]heptane-2-yl)sulfonyloxy}succinimide Other Acid Generator (A3):
(A3-1): Diphenyliodonium trifluoromethanesulfonate
(A3-2): Triphenylsulfonium trifluoromethanesulfonate
(A3-3): (p-fluorophenyl)(phenyl)iodonium trifluoromethanesulfonate Acid Diffusion Controller (C):
(C-1): Tri-n-octylamine
(C-2): N,N,N',N'-tetrakis(2-hydroxypropyl)ethylenediamine
(C-3): 2-phenylbenzimidazole
(C-4): N-(t-butoxycarbonyl) 2-phenylbenzimidazole Solvent (D):
(D-1): Ethyl lactate
(D-2): Ethyl 3-ethoxypropionate
(D-3): Propylene glycol monomethyl ether acetate Additive (E):
(E-1): Anthracene-9-carboxylic acid
(E-2): 9-carbazoyl acetate
(E-3): Anthracene-9-carboxylic acid t-butoxycarbonylmethyl Evaluation of resists was carried out as follows.

(1) Sensitivity (L/S):

A resist coating was formed on a silicon wafer, exposed to light, and immediately baked (PEB), followed by alkali development, washing with water, and drying. Sensitivity was evaluated based on an optimum exposed dose capable of forming a 1:1 line-and-space pattern (1L/1S) with a line width of 130 nm in each Examples and Comparative Examples.

(2) Sensitivity (5L/1S):

A resist coating was formed on a silicon wafer, exposed to light, and immediately baked (PEB), followed by alkali development, washing with water, and drying. Sensitivity was evaluated based on an optimum exposed dose capable of forming a 5:1 narrow space pattern (5L/1S) with a line width of 150 nm in each Examples and Comparative Examples.

(3) Focal Depth Allowance (L/S DOF):

A 130 nm line and space pattern (1L/1S) was exposed at an optimum dose while changing the depth of focus from −1.0 μm to +1.0 μm at an interval of 100 nm. The focal depth range in which the line width is in the range of 117 nm (−10%) to 143 nm (+10%) was taken as the focal depth allowance.

(4) Focal Depth Allowance (5L/1S DOF):

A 150 nm narrow space pattern (5L/1S) was exposed at an optimum dose while changing the depth of focus from −1.0 μm to +1.0 μm at an interval of 100 nm. The focal depth range in which the line width is in the range of 135 nm (−10%) to 165 nm (+10%) was taken as the focal depth allowance.

(5) Pattern Profile:

The dimensions of the upper side A and the lower side B of the cross-section of a line-and-space pattern (1L/1S) with a line width of 130 nm developed with an optimum dose of exposure were measured. A pattern shape that satisfied the formula "A/B≧0.85" was evaluated as "Good", a pattern shape satisfying the formula "A/B<0.85" evaluated as "Bad".

Example 7 to 10 and Comparative Example 3

The composition solutions were prepared by mixing the components in proportions shown in Table 3 and filtered the solution using a membrane filter with a pore diameter of 200 nm. In the Table 3, "part" refers to "part by weight". Then, the composition solution solutions were applied to a silicon wafer by spin coating in the Clean Track ("ACT-8", manufactured by Tokyo Electron Ltd.). After performing PB under the conditions shown in Table 4, a resist coating with a thickness of 400 nm was formed.

Then, the coating was exposed using a Stepper S203B (manufactured by Nikon Corp., lens numerical aperture: 0.68, σ 0.75, ½ orbicular zone lightning) through 6% halftone mask, and performed PEB under the conditions shown in Table 4. After performing PEB, the resist film was developed at 23° C. for one minute in a 2.38 wt % tetramethylammonium hydroxide aqueous solution by puddling, washed with water, and dried to form a resist pattern. The evaluation results of the resist are shown in Table 4.

TABLE 1

| | Resin(B) | Acid generator (A1) | Acid generator (A2) | Acid generator (A3) | Acid diffusion controller(C) | Solvent (D) |
|---|---|---|---|---|---|---|
| Example | | | | | | |
| 1 | B-1(100) | A1-1(2) | A2-1(6) | — | C-4(0.4) | D-1(400) D-3(400) |
| 2 | B-2(100) | A1-2(2) | A2-1(6) | — | C-3(0.4) | D-1(400) D-3(400) |
| 3 | B-1(100) | A1-1(1) | A2-2(6) | A3-1(1) | C-4(0.4) | D-1(400) D-3(400) |
| 4 | B-1(100) | A1-1(1) | A2-1(6) | A3-2(1) | C-3(0.4) | D-1(400) D-2(400) |
| 5 | B-3(100) | A1-1(2) | A2-3(6) | — | C-1(0.1) C-2(0.1) | D-1(400) D-3(400) |
| 6 | B-4(100) | A1-3(2) | A2-1(6) | — | C-4(0.4) | D-1(400) D-2(400) |
| Comparative Example | | | | | | |
| 1 | B-1(100) | — | A2-1(6) | — | C-4(0.4) | D-1(400) D-3(400) |
| 2 | B-1(100) | — | A2-1(6) | A3-3(2) | C-4(0.4) | D-1(400) D-3(400) |

TABLE 2

| | PB (° C.) | PB (second) | PEB (° C.) | PEB (second) | L/S Sensitivity (J/m$^2$) | 5L/1S Sensitivity (J/m$^2$) | L/S DOF (nm) | 5L/1S DOF (nm) | Pattern profile |
|---|---|---|---|---|---|---|---|---|---|
| Example | | | | | | | | | |
| 1 | 130 | 90 | 130 | 90 | 390 | 400 | 700 | 700 | Good |
| 2 | 130 | 90 | 130 | 90 | 410 | 400 | 800 | 800 | Good |
| 3 | 120 | 90 | 130 | 90 | 400 | 390 | 800 | 800 | Good |
| 4 | 120 | 90 | 130 | 90 | 380 | 380 | 700 | 700 | Good |
| 5 | 100 | 90 | 100 | 90 | 380 | 390 | 800 | 800 | Good |
| 6 | 130 | 90 | 130 | 90 | 390 | 390 | 700 | 700 | Good |
| Comparative Example | | | | | | | | | |
| 1 | 130 | 90 | 130 | 90 | 420 | 420 | 500 | 500 | Bad |
| 2 | 130 | 90 | 130 | 90 | 410 | 410 | 500 | 500 | Bad |

Evaluation of resists shown in Table 4 was carried out as follows.

(1) Sensitivity (L/S):

A resist coating was formed on a silicon wafer, exposed to light, and immediately baked (PEB), followed by alkali development, washing with water, and drying. Sensitivity was evaluated based on an optimum exposed dose capable of forming a 1:1 line-and-space pattern (1L/1S) with a line width of 140 nm in each Examples and Comparative Example.

(2) Sensitivity (5L/1S):

A resist coating was formed on a silicon wafer, exposed to light, and immediately baked (PEB), followed by alkali development, washing with water, and drying. Sensitivity was evaluated based on an optimum exposed dose capable of forming a 5:1 narrow space pattern (5L/1S) with a line width of 160 nm in each Examples and Comparative Example.

(3) Focal Depth Allowance (L/S DOF):

A 140 nm line and space pattern (1L/1S) was exposed at an optimum dose while changing the depth of focus from −1.0 μm to +1.0 μm at an interval of 100 nm. The focal depth range in which the line width is in the range of 126 nm (−10%) to 154 nm (+10%) was taken as the focal depth allowance.

(4) Focal Depth Allowance (5L/1S DOF):

A 160 nm narrow space pattern (5L/1S) was exposed at an optimum dose while changing the depth of focus from −1.0 μm to +1.0 μm at an interval of 100 nm. The focal depth range in which the line width is in the range of 144 nm (−10%) to 158 nm (+10%) was taken as the focal depth allowance.

(5) Pattern Profile:

The dimensions of the upper side A and the lower side B of the cross-section of a line-and-space pattern (1L/1S) with a line width of 140 nm developed with an optimum dose of exposure were measured. A pattern shape that satisfied the formula "A/B≧0.85" was evaluated as "Good", a pattern shape satisfying the formula "A/B<0.85" was evaluated as "Bad".

TABLE 3

|  | Resin(B) | Acid generator (A1) | Acid generator (A2) | Acid diffusion controller(C) | Additive (E) | Solvent (D) |
|---|---|---|---|---|---|---|
| Example |  |  |  |  |  |  |
| 7 | B-1(100) | A1-1(2) | A2-1(9) | C-4(0.4) | E-1(1) | D-1(500) |
|  |  |  | A2-4(3) |  | E-2(1) | D-3(200) |
| 8 | B-1(100) | A1-1(2) | A2-1(9) | C-4(0.4) | E-3(1) | D-1(500) |
|  |  |  | A2-4(3) |  |  | D-3(200) |
| 9 | B-1(100) | A1-1(2) | A2-1(9) | C-4(0.4) | E-2(1) | D-1(500) |
|  |  |  | A2-4(3) |  | E-3(1) | D-3(200) |
| 10 | B-1(100) | A1-1(2) | A2-1(9) | C-4(0.4) | — | D-1(500) |
|  |  |  | A2-4(3) |  |  | D-3(200) |
| Comparative Example |  |  |  |  |  |  |
| 3 | B-1(100) | — | A2-1(9) | C-4(0.4) | — | D-1(500) |
|  |  |  | A2-4(3) |  |  | D-3(200) |

TABLE 4

|  | (° C.) | PB (second) | (° C.) | PB (second) | L/S Sensitivity (J/m$^2$) | 5L/1S Sensitivity (J/m$^2$) | L/S DOF (nm) | 5L/1S DOF (nm) | Pattern profile |
|---|---|---|---|---|---|---|---|---|---|
| Example |  |  |  |  |  |  |  |  |  |
| 7 | 130 | 90 | 130 | 90 | 390 | 400 | 600 | 600 | Good |
| 8 | 130 | 90 | 130 | 90 | 410 | 430 | 500 | 500 | Good |
| 9 | 130 | 90 | 130 | 90 | 400 | 410 | 500 | 500 | Good |
| 10 | 130 | 90 | 130 | 90 | 410 | 420 | 400 | 400 | Good |
| Comparative Example |  |  |  |  |  |  |  |  |  |
| 3 | 130 | 90 | 130 | 90 | 420 | 440 | 200 | 300 | Bad |

The radiation-sensitive resin composition of the present invention not only exhibits high resolution and focal depth of line-and-space pattern (1L/1S), but also exhibits focal depth of narrow space pattern (5L/1S) as a chemically-amplified resist sensitive to active radiation particularly to deep ultraviolet rays by a KrF excimer laser. And the composition possesses also excels in a pattern profile. As a result, the composition can be suitably used in the field of microfabrication represented by the fabrication of semiconductor devices which are expected to become more and more miniaturized in the future.

The invention claimed is:

1. A positive type radiation-sensitive resin composition comprising
(A) a photoacid generator and (B) an acid-labile group-containing resin which is insoluble or scarcely soluble in alkali, but becomes alkali-soluble by the action of an acid,
wherein (A) the photoacid generator comprises a mixed photoacid generator containing (A1) a photoacid generator of the following formula (1) and (A2) a photoacid generator which is at least one compound selected from the group consisting of sulfonyloxyimides and disulfonyldiazomethanes,

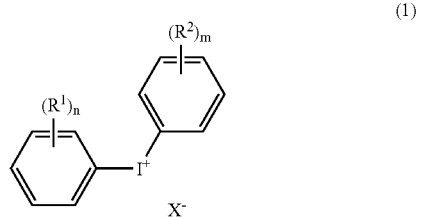

(1)

wherein $R^1$ represents a same or different monovalent organic group containing fluorine atoms, or a fluorine atom, $R^2$ represents a same or different monovalent organic group containing no fluorine atoms, or a hydrogen atom, n and m are integers of 1-5, and $X^-$ represents an anion of camphorsulfonic acid or nonafluorobutanesulfonic acid.

2. The positive type radiation-sensitive resin composition according to claim 1, wherein (B) the acid-labile group-containing resin comprises a recurring unit of the following formula (2),

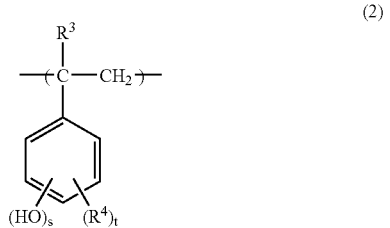

(2)

wherein $R^3$ represents a hydrogen atom or a methyl group, $R^4$ represents a monovalent organic group, two or more $R^4$ individually represent same or different, s is an integer of 1-3, and t is an integer of 0-3, provided that $s+t \leq 5$.

3. The positive type radiation-sensitive resin composition according to claim 2, wherein the $X^-$ is the anion of camphorsulfonic acid.

4. The positive type radiation-sensitive resin composition according to claim 3, wherein (A2) the photoacid generator comprises a sulfonyloxyimide.

5. The positive type radiation-sensitive resin composition according to claim 4, wherein the photoacid generator comprises a plurality of different sulfonyloxyimides.

6. The positive type radiation-sensitive resin composition according to claim 3, wherein (A2) the photo acid generator comprises a disulfonyldiazomethane.

7. The positive type radiation-sensitive resin composition according to claim 2, wherein the $X^-$ is the anion of nonafluorobutanesulfonic acid.

8. The positive type radiation-sensitive resin composition according to claim 7, wherein (A2) the photoacid generator comprises a sulfonyloxyimide.

9. The positive type radiation-sensitive resin composition according to claim 8, wherein the photoacid generator comprises a plurality of different sulfonyloxyimides.

10. The positive type radiation-sensitive resin composition according to claim 7, wherein (A2) the photoacid generator comprises a disulfonyldiazomethane.

11. The positive type radiation-sensitive resin composition according to claim 2, wherein (B) the acid-labile group-containing resin further comprises a recurring unit which is at least one recurring unit selected from the group consisting of a recurring unit of the following formula (3) and a recurring unit of the following formula (4),

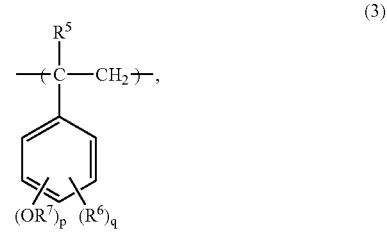

(3)

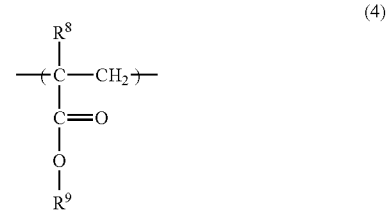

(4)

wherein $R^5$ represents a hydrogen atom or a methyl group, $R^6$ represents a monovalent organic group, $R^7$ represents a monovalent acid-labile group, p is an integer of 1-3, q is an integer of 0-3, provided that $p+q \leq 5$ of the formula (3), $R^8$ represents a hydrogen atom or a methyl group, and $R^9$ represents a t-butyl group, a 1-methylcyclopentyl group or a 1-ethylcyclopentyl group of the formula (4).

12. The positive type radiation-sensitive resin composition according to claim 1, wherein the photoacid generator (A) consists of a photoacid generator of the formula (1) and at least one compound selected from the group consisting of sulfonyloxyimides and disulfonyldiazomethanes.

13. The positive type radiation-sensitive resin composition according to claim 1, wherein the photoacid generator (A) further comprises a photoacid generator (A3) selected from the group consisting of an onium salt, a sulfone compound, a sulfonic acid ester compound, an oximesulfonate compound and a hydrazinesulfonate compound.

14. The composition of claim 13, wherein the photoacid generator (A3) is an onium salt.

15. A positive type radiation-sensitive resin composition comprising
(A) a photoacid generator and (B) an acid-labile group-containing resin which is insoluble or scarcely soluble in alkali, but becomes alkali-soluble by the action of an acid,
wherein (A) a photoacid generator of the following formula (1) and (A2) a photoacid generator which is at least one compound selected from the group consisting of sulfonyloxyimides and disulfonyldiazomethanes,

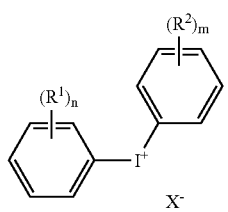

(1)

wherein each $R^1$ represents a same or different monovalent organic group consisting fluorine atoms or a fluorine atom, $R^2$ independently represents a same or different monovalent organic group containing no fluorine atoms, n and m are integers of 1-5, and $X^-$ represents an anion of camphorsulfonic acid or nonafluorobutanesulfonic acid.

16. The positive type radiation-sensitive resin composition according to claim 15, wherein (B) the acid-labile group-containing resin comprises a recurring unit of the following formula (2),

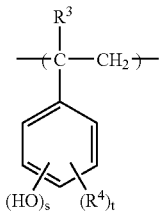

(2)

wherein $R^3$ represents a hydrogen atom or a methyl group, $R^4$ represents a monovalent organic group, two or more $R^4$ represent same or different, s is an integer of 1-3, and t is an integer of 0-3, provided that $s+t \leqq 5$.

17. The positive type radiation-sensitive resin composition according to claim 16, wherein the $X^-$ is the anion of camphorsulfonic acid.

18. The positive type radiation-sensitive resin composition according to claim 17, wherein (A2) the photoacid generator is a sulfonyloxyimide.

19. The positive type radiation-sensitive resin composition according to claim 17, wherein (A2) the photoacid generator is a disulfonyldiazomethane.

20. The positive type radiation-sensitive resin composition according to claim 16, wherein the $X^-$ is the anion of nonafluorobutanesulfonic acid.

21. The positive type radiation-sensitive resin composition according to claim 20, wherein (A2) the photoacid generator is a sulfonyloxyimide.

22. The positive type radiation-sensitive resin composition according to claim 20, wherein (A2) the photoacid generator is a disulfonyldiazomethane.

23. The positive type radiation-sensitive resin composition according to claim 16, wherein (B) the acid-labile group-containing resin further comprises a recurring unit which is at least one recurring unit selected from the group consisting of a recurring unit of the following formula (3) and a recurring unit for the following formula (4),

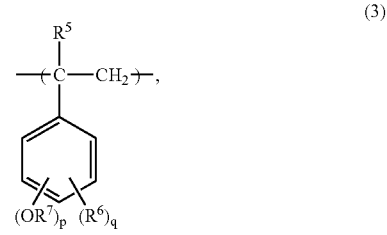

(3)

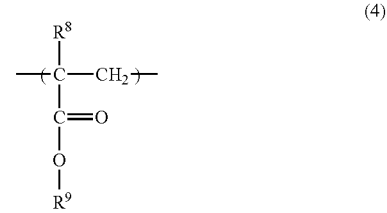

(4)

wherein $R^5$ represents a hydrogen atom or a methyl group, $R^6$ represents a monovalent organic group, $R^7$ represents a monovalent acid-labile group, p is an integer of 1-3, q is an integer of 0-3, provided that $p+q \leqq 5$ of the formula (3), $R^8$ represents a hydrogen atom or a methyl group, and $R^9$ represents t-butyl group, 1-methylcyclopentyl group or 1-ethylcyclopentyl group of the formula (4).

* * * * *